United States Patent
Qi et al.

(10) Patent No.: US 9,524,908 B2
(45) Date of Patent: Dec. 20, 2016

(54) METHODS OF REMOVING PORTIONS OF FINS BY PREFORMING A SELECTIVELY ETCHABLE MATERIAL IN THE SUBSTRATE

(71) Applicant: GLOBALFOUNDRIES Inc., Grand Cayman (KY)

(72) Inventors: Yi Qi, Niskayuna, NY (US); Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 284 days.

(21) Appl. No.: 14/242,529

(22) Filed: Apr. 1, 2014

(65) Prior Publication Data

US 2015/0279959 A1    Oct. 1, 2015

(51) Int. Cl.
*H01L 21/308* (2006.01)
*H01L 21/3213* (2006.01)
*H01L 21/8234* (2006.01)

(52) U.S. Cl.
CPC .................. *H01L 21/823431* (2013.01)

(58) Field of Classification Search
CPC .................. H01L 21/027; H01L 21/31144
See application file for complete search history.

(56) References Cited

U.S. PATENT DOCUMENTS

| | | | |
|---|---|---|---|
| 8,293,602 B2 * | 10/2012 | Juengling | H01L 21/823431 257/331 |
| 2008/0029481 A1 * | 2/2008 | Kothari | B81C 1/00579 216/58 |
| 2015/0147886 A1 * | 5/2015 | Tung | C23G 1/02 438/696 |

* cited by examiner

*Primary Examiner* — Mohammad Choudhry
(74) *Attorney, Agent, or Firm* — Amerson Law Firm, PLLC

(57) ABSTRACT

One illustrative method disclosed herein includes, among other things, forming a region of a sacrificial material in a semiconductor substrate at a location where the portion of the fin to be removed will be located, after forming the region of sacrificial material, performing at least one first etching process to form a plurality of fin-formation trenches that define the fin, wherein at least a portion of the fin is comprised of the sacrificial material, and performing at least one second etching process to selectively remove substantially all of the sacrificial material portion of the fin relative to the substrate.

22 Claims, 12 Drawing Sheets

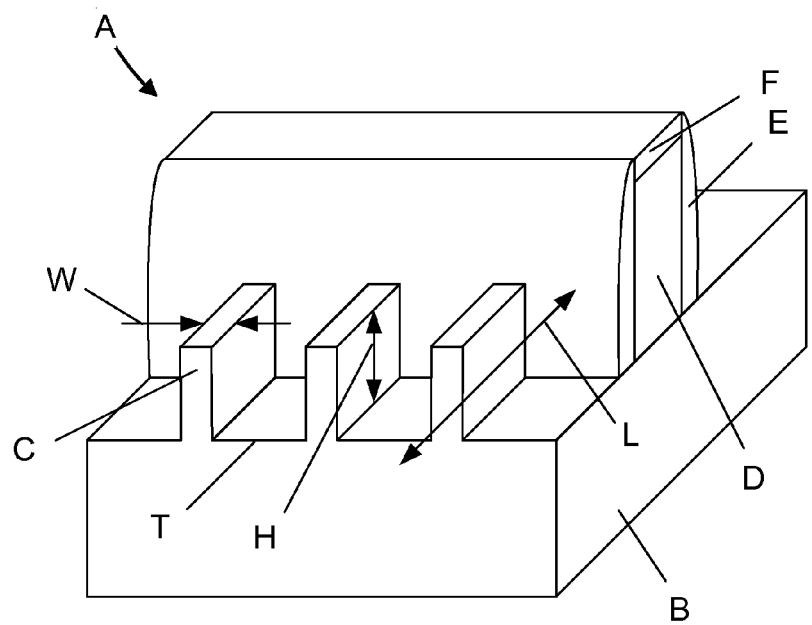
Figure 1A (Prior Art)
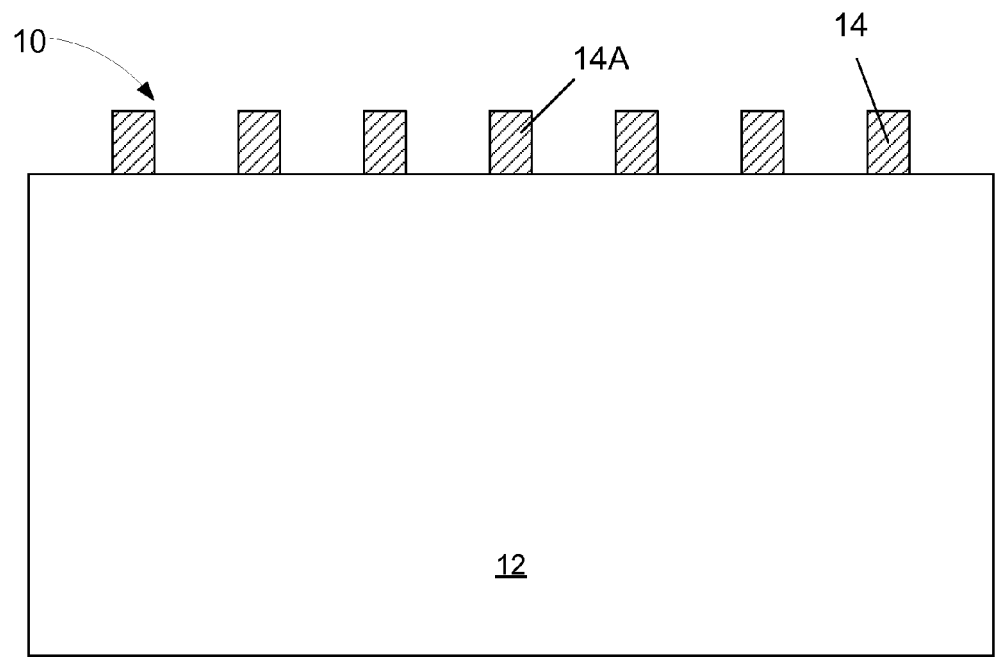
(Prior Art) Figure 1B

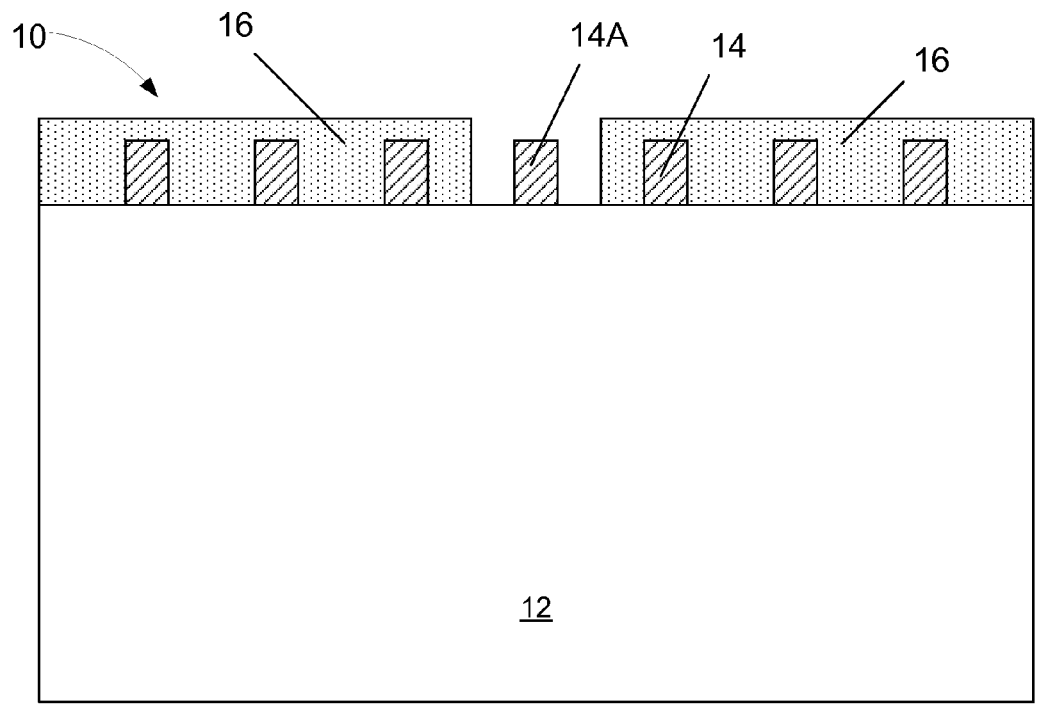
(Prior Art) Figure 1C
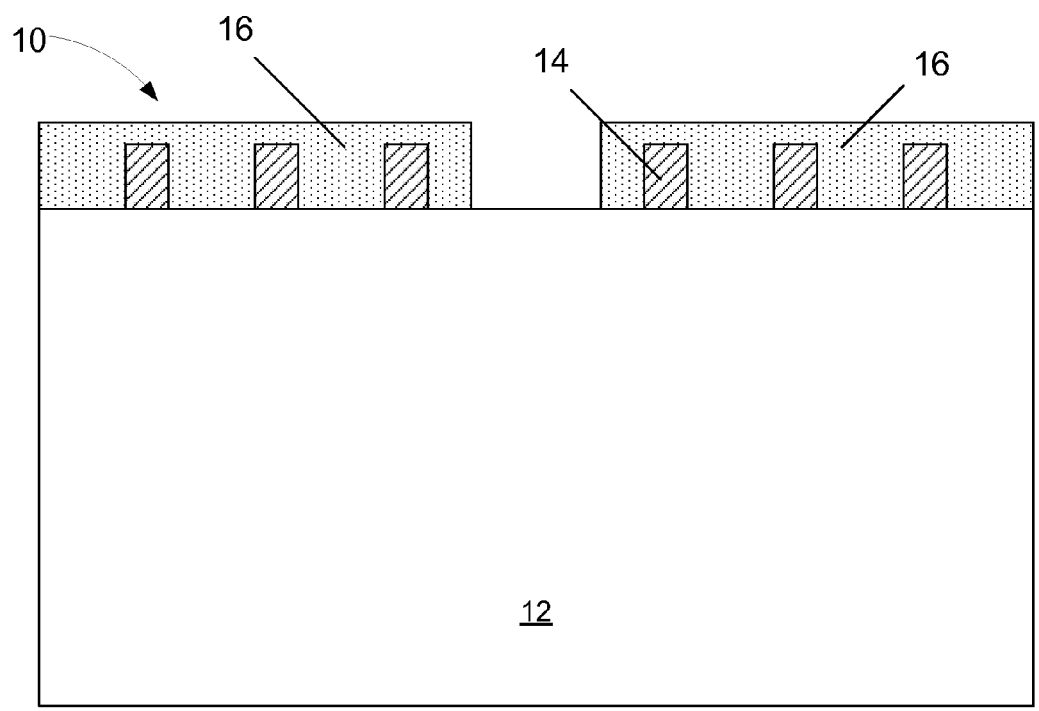
(Prior Art) Figure 1D

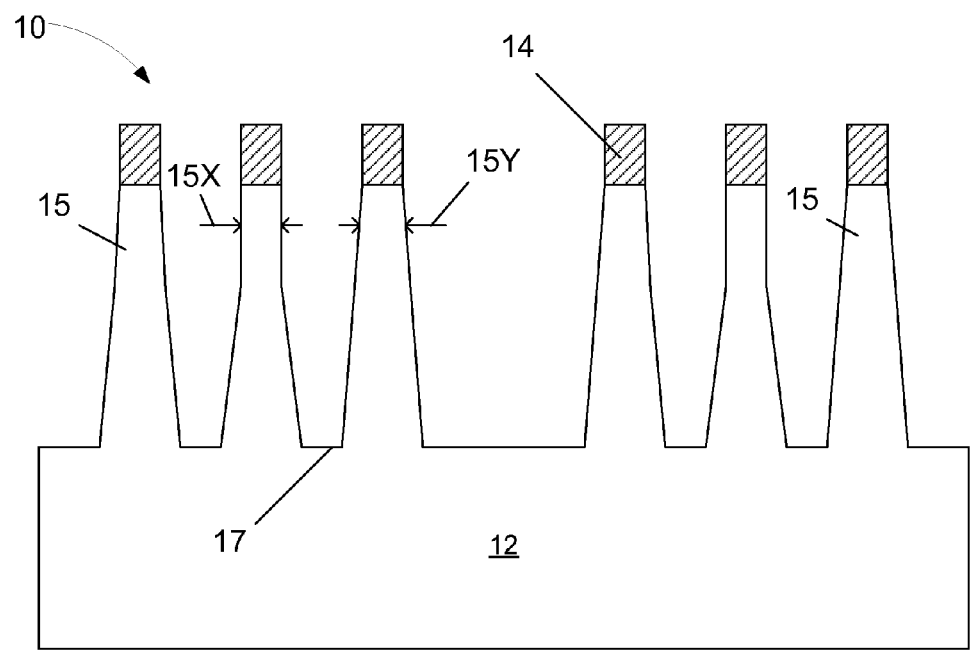
(Prior Art) Figure 1E
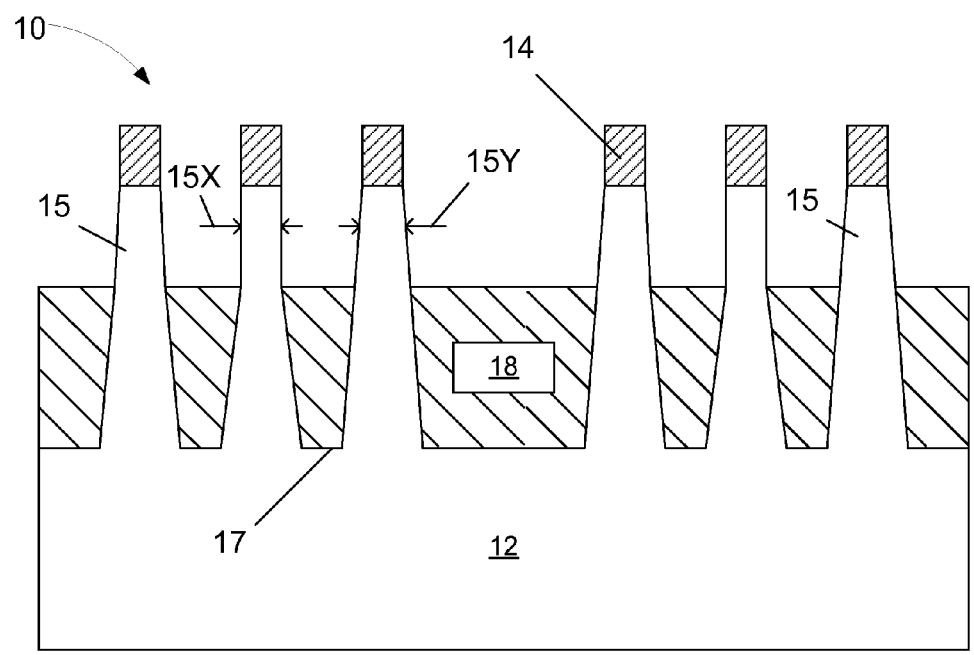
(Prior Art) Figure 1F

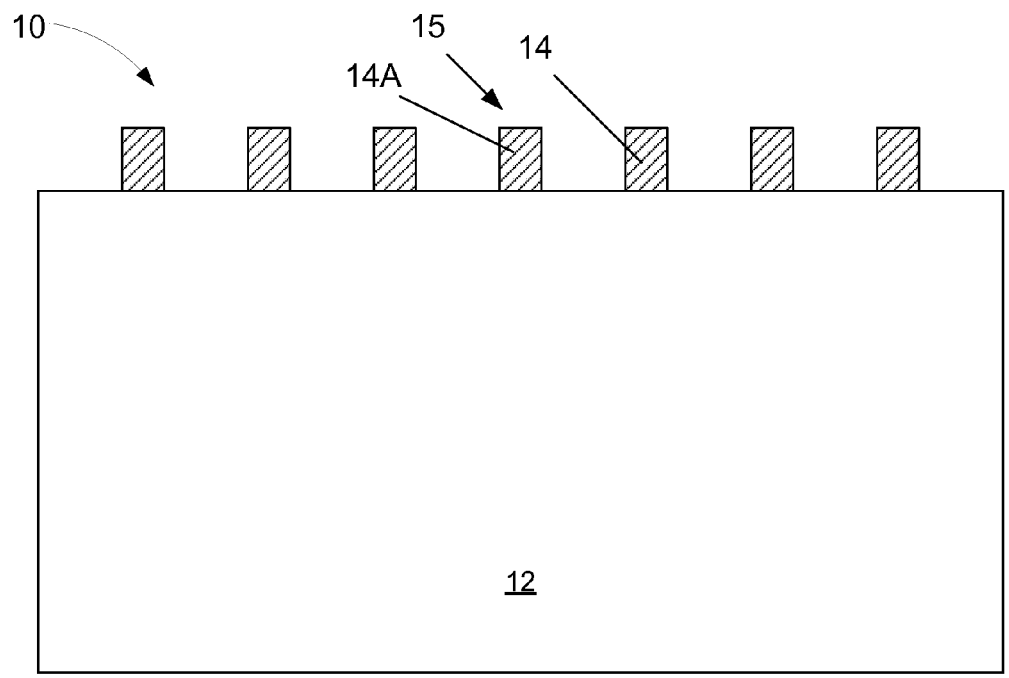
(Prior Art) Figure 1G
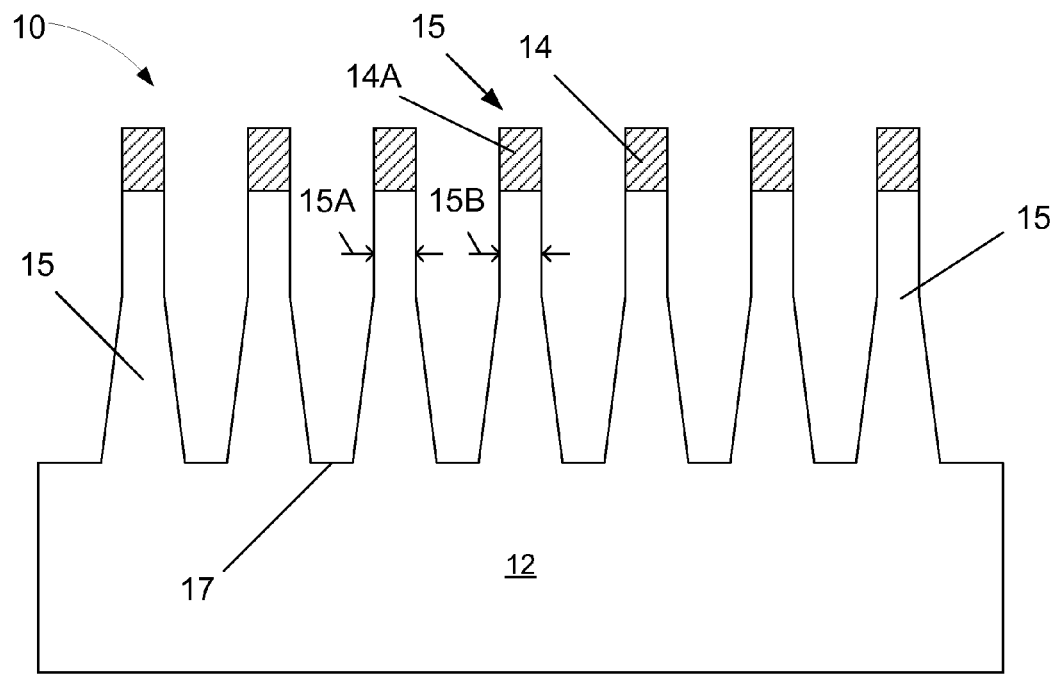
(Prior Art) Figure 1H

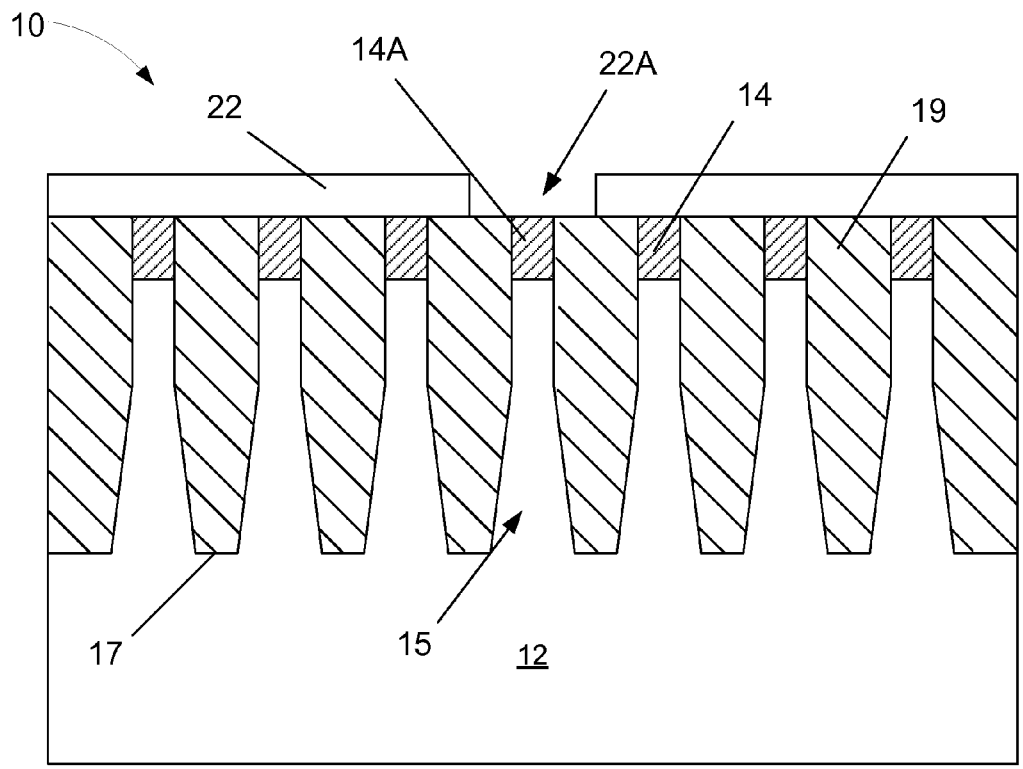
(Prior Art) Figure 1I
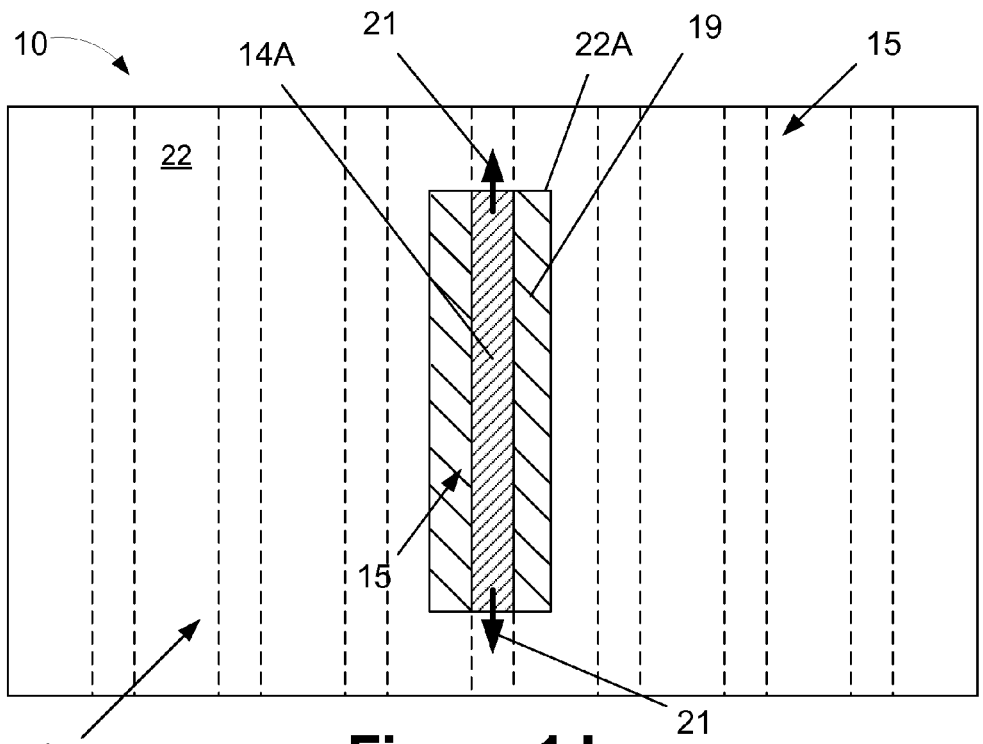
(Prior Art) Figure 1J

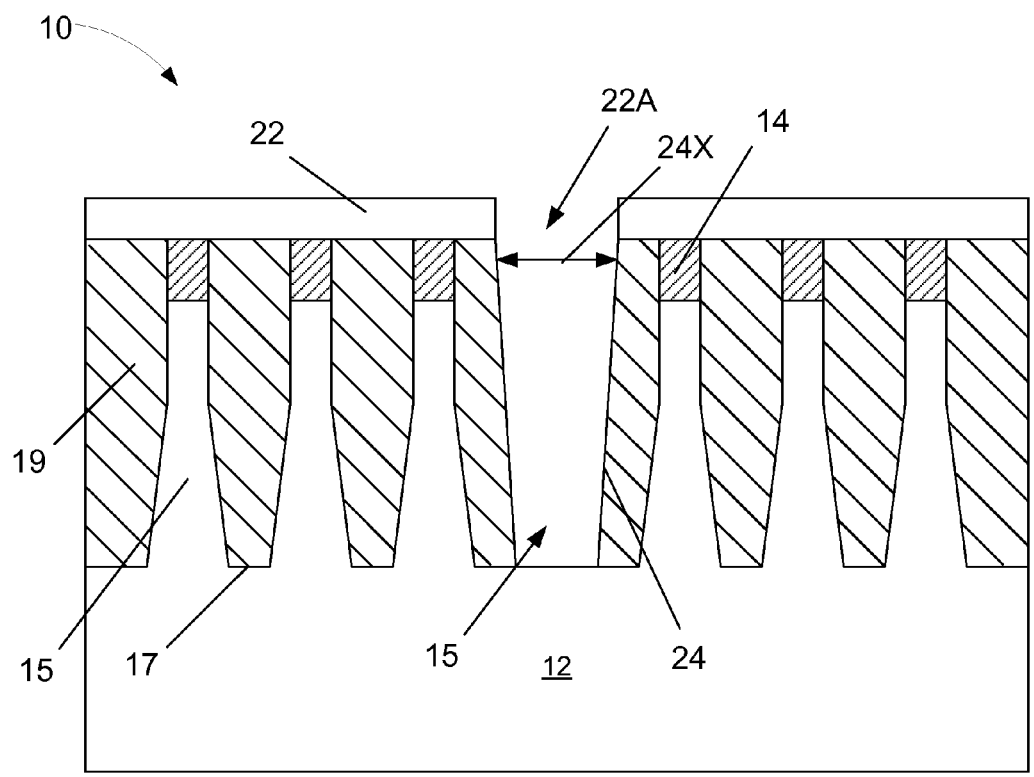
(Prior Art) Figure 1K
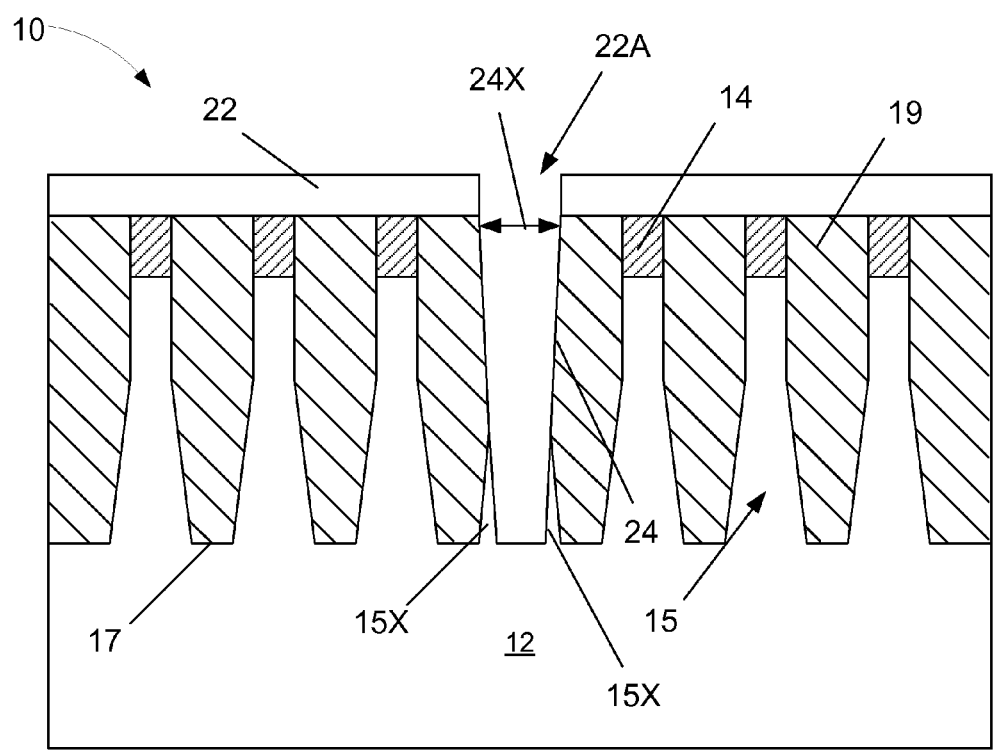
(Prior Art) Figure 1L

METHODS OF REMOVING PORTIONS OF FINS BY PREFORMING A SELECTIVELY ETCHABLE MATERIAL IN THE SUBSTRATE

BACKGROUND OF THE INVENTION

1. Field of the Invention

Generally, the present disclosure relates to the manufacture of semiconductor devices, and, more specifically, to various methods of forming fins for FinFET semiconductor devices wherein the removal of portions of the fins is accomplished by preforming a selectively etchable material in the substrate at the location of the to-be-removed portions of the fins.

2. Description of the Relate Art

In modern integrated circuits, such as microprocessors, storage devices and the like, a very large number of circuit elements, especially transistors, are provided and operated on a restricted chip area. Generally, in complex circuitry including complex logic portions, CMOS technology is presently a preferred manufacturing technique in view of device performance and/or power consumption and/or cost efficiency. In integrated circuits fabricated using CMOS technology, field effect transistors (FETs—both NMOS and PMOS devices) are provided that are typically operated in a switched mode. The transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. Trenches T are formed in the substrate B to define the fins C. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A.

Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Both planar FET and FinFET semiconductor devices have an isolation structure, e.g., a shallow trench isolation structure, that is formed in the semiconducting substrate around the device so as to electrically isolate the semiconductor device. Traditionally, isolation structures were always the first structure that was formed when manufacturing semiconductor devices. The isolation structures were formed by etching the trenches for the isolation structures and thereafter filling the trenches with the desired insulating material, e.g., silicon dioxide. After the isolation structures were formed, various process operations were performed to manufacture the semiconductor device. In the case of a FinFET device, this involved masking the previously formed isolation structure and etching the trenches in the substrate that defined the fins. As FinFET devices have been scaled to meet ever increasing performance and size requirements, the width W of the fins C has become very small, e.g., 6-12 nm, and the fin pitch has also been significantly decreased, e.g., the fin pitch may be on the order of about 30-60 nm.

However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate.

There are two commonly employed techniques for accomplishing the goal of removing the desired number of fins C. One such removal process is typically referred to as "Fins-cut-First," as will be described with reference to FIGS. 1B-1E. Accordingly, FIG. 1B depicts the device 10 after a patterned hard mask layer 14, e.g., a patterned layer of silicon nitride, was formed above the substrate 12 in accordance with the desired fin pattern and pitch. In the depicted example, only a feature 14A in the hard mask layer 14 will be removed. By removing the feature 14A, a fin structure that would have otherwise been formed under the feature 14A will not be formed, thereby making room for the isolation region. However, as will be recognized by those skilled in the art, depending upon the desired final size of the isolation region, more than one feature in the hard mask layer 14 may be removed.

FIG. 1C depicts the device 10 after a patterned masking layer 16, e.g., a patterned layer of photoresist, has been formed above the patterned hard mask layer 14. The patterned masking layer 16 has an opening that exposes the feature 14A for removal.

FIG. 1D depicts the device 10 after an etching process has been performed through the patterned masking layer 16 so as to remove the exposed feature 14A of the patterned hard mask layer 14.

FIG. 1E depicts the device 10 after the patterned masking layer 16 was removed and after an anisotropic etching process was performed through the patterned hard mask layer 14 (without the feature 14A) so as to define full-depth trenches 17 in the substrate 12 that define the fins 15. Due to the removal of the feature 14A, this etching process removes the portions of the substrate 12 that would have otherwise formed a fin 15 in the area under the feature 14A. One problem with the "fin-cut-first" approach is that it inevitably causes different fin sizes, i.e., the dimensions 15X and 15Y are different. This is especially true between fins 15 inside an array of fins and the fins at the edge of the active region that is close to the isolation region. This occurs due to "etch loading" effects wherein there are different etch rates and etch profiles due to differing patterning densities, pitch, etc.

FIG. 1F depicts the device 10 after several process operations were performed. First, a layer of insulating material 18, such as silicon dioxide, was formed so as to overfill the trenches 17. A chemical mechanical polishing (CMP) process was then performed to planarize the upper surface of the insulating material 18 with the top of the patterned hard mask 14. Thereafter, an etch-back process was performed to recess the layer of insulating material 18 between the fins 15 and thereby expose the upper portions of the fins 15, which corresponds to the final fin height of the fins 15. At this point in the process, the patterned hard mask 14 may or may not be thereafter removed. Next, the gate structure of the device 10 may be formed using either gate-first or gate-last manufacturing techniques.

Another fin removal process is typically referred to as "Fins-cut-Last," as will be described with reference to FIGS. 1G-1J. FIG. 1G depicts the device 10 after the patterned hard mask layer 14 was formed above the substrate 12 in accordance with the desired fin pattern and pitch. The patterned hard mask 14 extends across the entire substrate at this point in the fabrication process. As before, in the depicted example, only a single fin will be removed, i.e., the fin 15 corresponding to the feature 14A, to make room for the isolation region. However, as will be recognized by those skilled in the art, depending upon the desired final size of the isolation region, more than one fin may be removed.

FIG. 1H depicts the device 10 after an anisotropic etching process was performed through the patterned hard mask layer 14 so as to define full-depth trenches 17 in the substrate 12 that define the fins 15. Note that, in the Fins-cut-Last approach, the size of the fins is very uniform up near the top of the initial fins 15, i.e., the dimension 15A is approximately equal to the dimension 15B. This is primarily due to the fact that, in this approach, fins 15 are formed everywhere on the wafer and there is no undesirable etch loading effects.

FIGS. 1I-1K depict the device 10 after several process operations were performed. First, a layer of insulating material 19, such as silicon dioxide, was formed so as to overfill the trenches 17. Then a CMP process was performed to planarize the upper surface of the layer of insulating material 19 with the patterned hard mask layer 14. Next, a patterned masking layer 22, e.g., a patterned layer of photoresist, was formed above the layer of insulating material 19. The patterned hard mask layer 22 has an opening 22A positioned above the portion of the underlying fin that is to be removed. FIG. 1J is a plan view of the patterned masking layer 22 with a generally rectangular-shaped opening 22A positioned above the portion of the underlying fin that is to be removed.

FIG. 1K depicts the device 10 after one or more anisotropic etching processes were performed to remove the exposed portions of the layer of insulating material 19, the exposed portions of the hard mask layer 14, i.e., the feature 14A, and the underlying portions of the fin 15. This results in the formation of a trench 24 in the layer of insulating material 19. Typically, as shown in the plan view in FIG. 1J the trench 24 will take the form of a rectangle that corresponds approximately to the opening 22A in the patterned hard mask layer 22. Inevitably, there will be some inward tapering of the sidewalls of the trench 24. Although not depicted in the drawings, after the trench 24 is formed, the patterned masking layer 22 will be removed and additional oxide material (not shown) will be formed through the opening 22A in the trench 24 where the fin 15 was removed. Then a chemical mechanical polishing (CMP) process will be performed to planarize the upper surface of all of the insulating materials with the top of the patterned hard mask 14. Thereafter, the isolation regions between devices will be masked and an etch-back process will be performed to recess the layer of insulating material 19 between the fins 15 for each device and thereby expose the upper portions of the fins 15, which corresponds to the final fin height of the fins 15.

There are at least two possible problems with the fins-cut-last approach that generally relate to the size or critical dimension (CD) 24X of the opening 22A of the trench 24. With reference to FIG. 1L, if the CD 24X of the opening 22A is too small, there will typically be some residual portion 15X of the fin 15 remaining at the bottom of the trench 24. If the CD 24X of the opening 22A is increased in an effort to insure complete removal of the unwanted residual fin materials 15X at the bottom of the trench 24, then there is a much greater likelihood of damaging the fins adjacent the trench 24 when it is etched. These issues only get worse as the depth of the trench 24 increases and as packing densities increase.

Some of the aforementioned problems could potentially be remedied by performing a selective isotropic etching process to limit or eliminate the residual fin material 15X relative to the surrounding insulating material 19. In one sense, removing the unwanted residual fin material 15X by performing such an isotropic etching process would be beneficial as compared to removing the fins by performing an anisotropic etching process because, due to the selective and isotropic nature of the process, there would be less chance of damaging adjacent fins (if the CD 24X is too large) and less chance of leaving the undesirable residual fin material 15X at or near the bottom of the trench 24 (if the CD 24X is too small). However, with reference to FIG. 1J, performing such an isotropic etching process may cause unwanted loss of the remaining portions of the fin 15 are positioned below the edges of the rectangular opening 22A (when viewed from above) in the patterned masking layer 22. That is, due to the nature of an isotropic etching process, there may be some undesirable loss of the fin material in the directions indicated by the arrows 21 in FIG. 1J.

The present disclosure is directed to various methods of forming fins for FinFET semiconductor devices and selectively removing some of the fins by performing a cyclical fin cutting process that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins for FinFET semiconductor devices wherein the removal of portions of the fins is accomplished by preforming a selectively etchable material in the substrate at the location of the to-be-removed portions of the fins. One illustrative method disclosed herein includes, among other things, forming a region of a sacrificial material in a semiconductor substrate at a location where the portion of the fin to be removed will be located, after forming the region of sacrificial material, performing at least one first etching process to form a plurality of fin-formation trenches that define the fin, wherein at least a portion of the fin is comprised of the sacrificial material, and performing at least one second etching process to selectively remove substantially all of the sacrificial material portion of the fin relative to the substrate.

In another embodiment, a method disclosed herein includes, among other things, forming a first patterned masking layer above a semiconductor substrate, the first patterned masking layer having an opening in a position that corresponds to a location where a portion of the fin to be removed will be located, the opening in the first patterned masking layer exposing a surface of the substrate, performing at least one first etching process through the opening in the first patterned masking layer to form a sacrificial material trench in the substrate, forming the sacrificial material so as to over-fill the sacrificial material trench with the sacrificial material, performing at least one process operation to remove the first patterned masking layer from above the substrate and to planarize an upper surface of the sacrificial material within the sacrificial material trench with an upper surface of the substrate, after performing the at least one process operation, forming a second patterned masking layer above the substrate, performing at least one second etching process through the second patterned masking layer to form a plurality of fin-formation trenches that define the fin, wherein at least a portion of the fin is comprised of the sacrificial material, and performing at least one third etching process to selectively remove substantially all of the sacrificial material portion of the fin relative to the substrate.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1L depict illustrative prior art methods of removing selected fin structures when forming FinFET semiconductor devices.

Figure 2A:
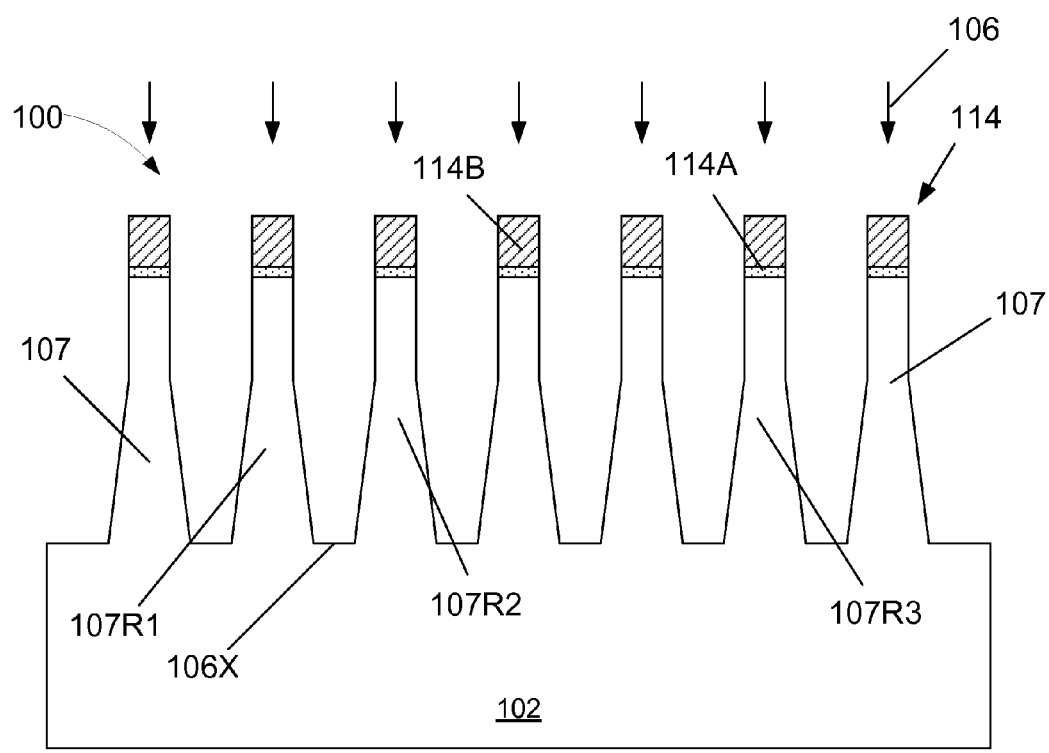
FIGS. 2A-2K depict various illustrative methods disclosed herein for removing portions of the fins that are formed across a substrate by preforming a selectively etchable material in the substrate at the location of the to-be-removed portions of the fins.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming fins for FinFET semiconductor devices wherein the removal of portions of the fins is accomplished by preforming a selectively etchable material in the substrate at the location of the to-be-removed portions of the fins. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

FIGS. 2A-2K depict one illustrative embodiment of a method disclosed herein of forming fins on a FinFET semiconductor device 100 that is formed on a bulk semiconducting substrate 102. As will be recognized by those skilled in the art after a complete reading of the present application, the integrated circuit product 100 described herein may be comprised of either N-type FinFET devices, P-type FinFET devices or both (i.e., a CMOS application). In this illustrative embodiment, the substrate 102 has a bulk semiconducting material configuration. The substrate 102 may be made of silicon or it may be made of materials other than silicon. Thus, the terms "substrate" or "semiconductor substrate" should be understood to cover all forms of all semiconductor materials.

FIG. 2A depicts the intended pattern of the fins 107 that will be formed in the substrate. FIG. 2A is provided to explain some aspects of the claimed methods wherein regions of the substrate where certain portions of certain fins will be removed are identified prior to the formation of any fins. These identified regions are then manufactured as described below. Moreover, fins that are eventually formed in these specifically identified regions of the substrate are formed and removed in accordance with the novel manufacturing methods disclosed herein.

With continuing reference to FIG. 2A, the fins 107R1-R3 (collectively referred to using the reference number 107R) are fins wherein portions or the entirety of the fin (in the axial, current-transport direction) will be removed as part of forming the integrated circuit product 100. In general, the fins 107 will ultimately be formed by forming a trench patterning masking layer 114, e.g., a patterned trench-patterning hard mask layer 114, above the substrate 102 that corresponds to the desired pattern of fins 107 to be formed in the substrate 102. Thereafter, one or more etching processes 106 will be performed through the trench-patterning hard mask layer 114 to define a plurality of fin-formation trenches 106X in the substrate 102 so as to thereby form the fins 107. Due to the fact that the fins 107 are formed across the substrate, there is little or no undesirable variation in the width (CD) of the initial fins 107 since there is no adverse etch loading effects, as discussed in the background section of this application. The magnitude of the fin height may vary depending upon the particular device under construction, e.g., 100-200 nm. In the depicted example herein, portions of three of the initial fins 107 will be removed using the process flows disclosed below. Of course, as will be appreciated by those skilled in the art after a complete reading of the present application, any desired number of fins can be removed using the methods disclosed herein and the entire axial length of one or more of the fins 107R may be removed using the methods disclosed herein.

In the illustrative example depicted in the attached figures, the fin-formation trenches 106X and the initial fins 107 are all of a uniform size and shape. However, such uniformity in the size and shape of the fin-formation trenches 106X and the initial fins 107 is not required to practice at least some aspects of the inventions disclosed herein. In the example depicted herein, the fin-formation trenches 106X are depicted as having been formed by performing a plurality of anisotropic etching processes. In some cases, the fin-formation trenches 106X may have a reentrant profile near the bottom of the fin-formation trenches 106X. To the extent the fin-formation trenches 106X are formed by performing a wet etching process, the fin-formation trenches 106X may tend to have a more rounded configuration or non-linear configuration as compared to the generally linear configuration of the fin-formation trenches 106X that are formed by performing an anisotropic etching process. In other cases, the fin-formation trenches 106X may be formed in such a manner that the initial fins 107 have a tapered cross-sectional configuration (wider at the bottom than at the top at this point in the process flow). Thus, the size and configuration of the fin-formation trenches 106X, and the manner in which they are made, should not be considered a limitation of the present invention.

The trench-patterning hard mask layer 114 is intended to be representative in nature as it may be comprised of a variety of materials, such as, for example, a photoresist material, silicon nitride, silicon oxynitride, etc. Moreover, the trench-patterning hard mask layer 114 may be comprised of multiple layers of material, such as, for example, a so-called pad oxide layer 114A and a so-called pad nitride layer (silicon nitride) 114B. The trench-patterning hard mask layer 114 may be formed by depositing the layer(s) of material that comprise the trench-patterning hard mask layer 114 and thereafter directly patterning the trench-patterning hard mask layer 114 using known photolithography and etching techniques. Alternatively, the trench-patterning hard mask layer 114 may be formed by using known sidewall image transfer techniques. Thus, the particular form and composition of the trench-patterning hard mask layer 114 and the manner in which it is made should not be considered a limitation of the present invention. In the case where the trench-patterning hard mask layer 114 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

Figure 2B:
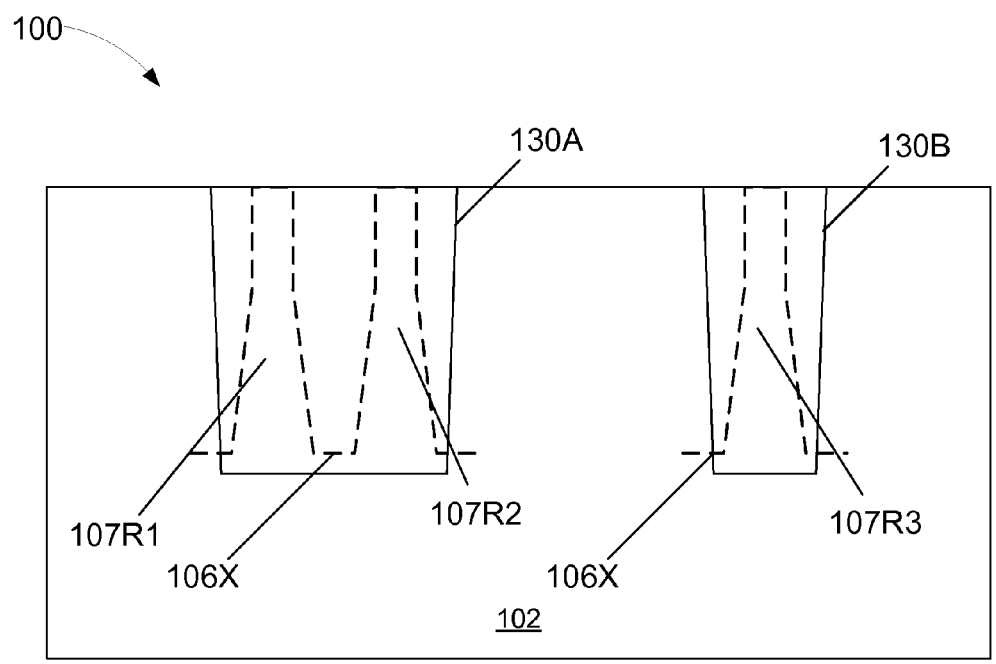

FIG. 2B depicts the initial starting substrate 102 prior to the formation of any fins 107 in the substrate 102. In general, based upon the intended pattern of the yet-to-be-formed fins 107 (as shown in FIG. 2A), the methods disclosed herein involve identifying and accurately locating the corresponding regions in the initial substrate 102 (FIG. 2B) where the desired portions of the to-be-removed fins 107R will be formed in the substrate. Accordingly, FIG. 2B depicts a first region 130A that corresponds to the to-be-removed portions of the fins 107R1 and 107R2, while the second region 130B corresponds to the to-be-removed portion of the fin 107R3. The regions 130A-B are of such a size that the to-be-removed portions of the fins 107R will fall within the regions 130A-B. At this point in fabrication, trenches that correspond to the regions 130A-B have yet to be formed in the substrate 102.

Figure 2C:
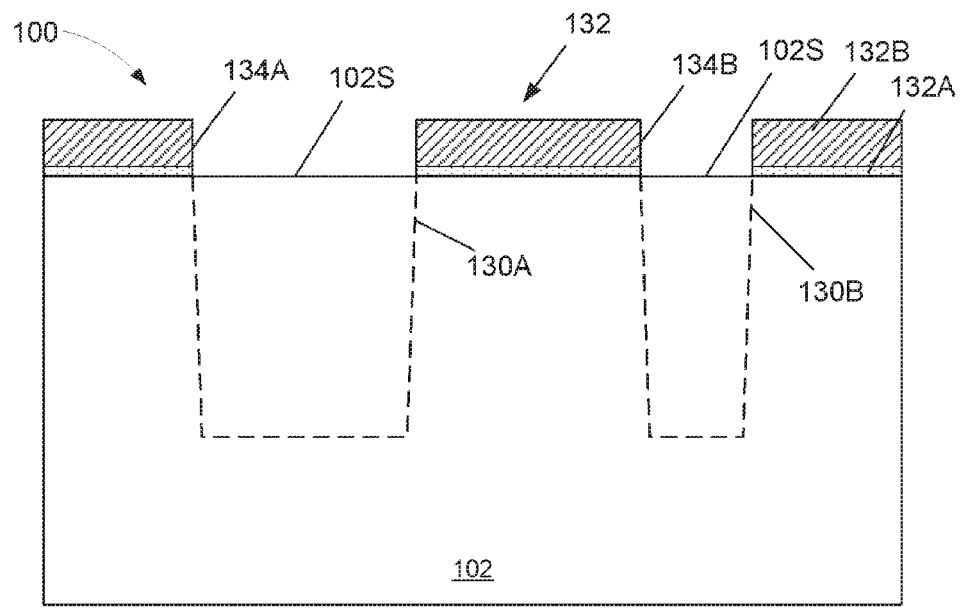
Figure 2D:
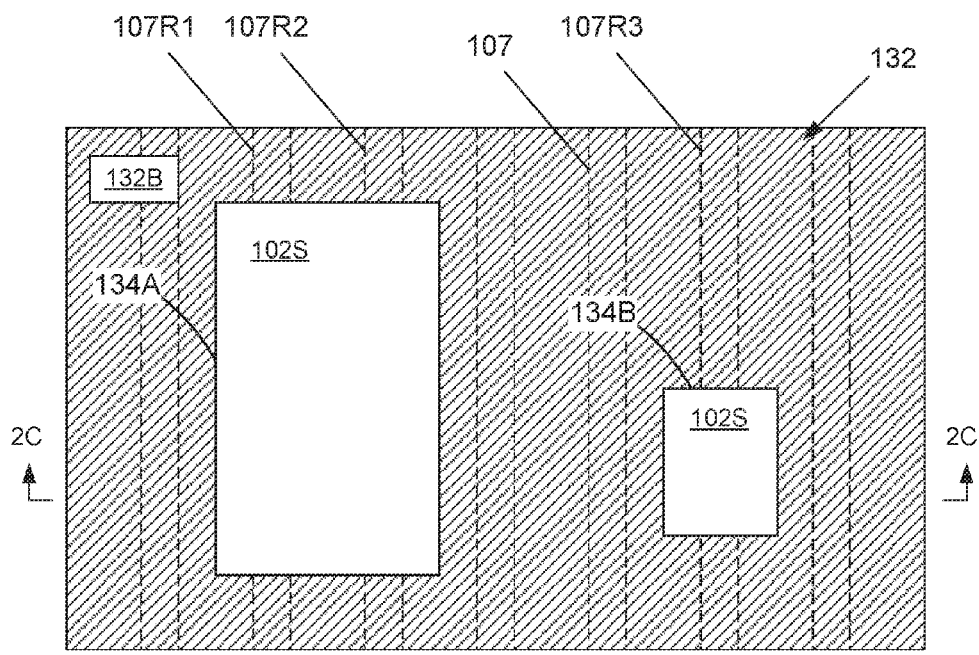

With reference to FIGS. 2C-D, based on the pattern and location of the regions 130A-B shown in FIG. 2A, a first patterned masking layer 132 with openings 134A-B is formed above the substrate 102. The openings 134A-B expose the underlying surface 102S of the substrate 102 at locations that correspond to the location and configuration of the regions 130A-B, respectively. FIG. 2D is a plan view of the product 100 that shows the location where the cross-sectional view in FIG. 2C is taken. The fins 107, 107R are depicted in dashed lines in FIG. 2D as the fins 107, 107R have not yet been formed. In the depicted example, the openings 134A-B are generally rectangular-shaped openings when viewed from above that are positioned above only a portion of the entire axial length of the fins 107R after they are formed. Of course, the openings in the patterned mask layer 132 may have other configurations, e.g., an "L"-shaped configuration, and they may be large enough to cover the entire axial length of one or more of the fins 107R. The overall size of the openings 134A-B may also vary depending upon the particular application.

The patterned masking layer 132 is intended to be representative in nature as it may be comprised of a variety of materials, such as, for example, a photoresist material, silicon nitride, silicon oxynitride, etc. Moreover, the patterned masking layer 132 may be comprised of multiple layers of material, such as, for example, a so-called pad oxide layer 132A and a so-called pad nitride layer (silicon nitride) 132B. The patterned masking layer 132 may be formed by depositing the layer(s) of material that comprise the patterned masking layer 132 and thereafter directly patterning the patterned masking layer 132 using known photolithography and etching techniques. Alternatively, the patterned masking layer 132 may be formed by using known sidewall image transfer techniques. Thus, the particular form and composition of the patterned masking layer 132 and the manner in which it is made should not be considered a limitation of the present invention.

Figure 2E:
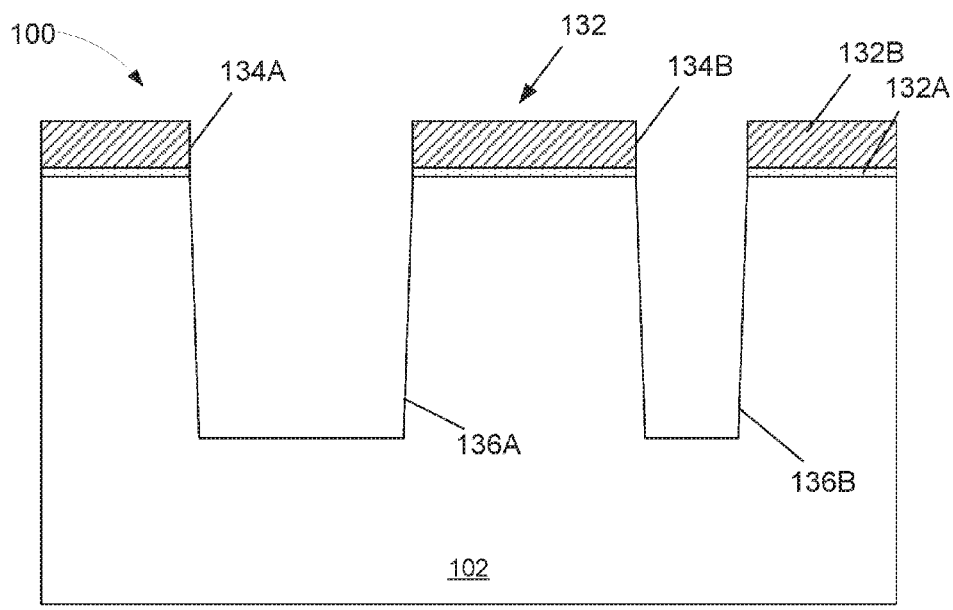

FIG. 2E depicts the product 100 after a first etching process, an anisotropic etching process, was performed through the patterned masking layer 132 to define a plurality of sacrificial material trenches 136A-B in the substrate 102 at locations that correspond to the location and configuration of the regions 130A-B.

Figure 2F:
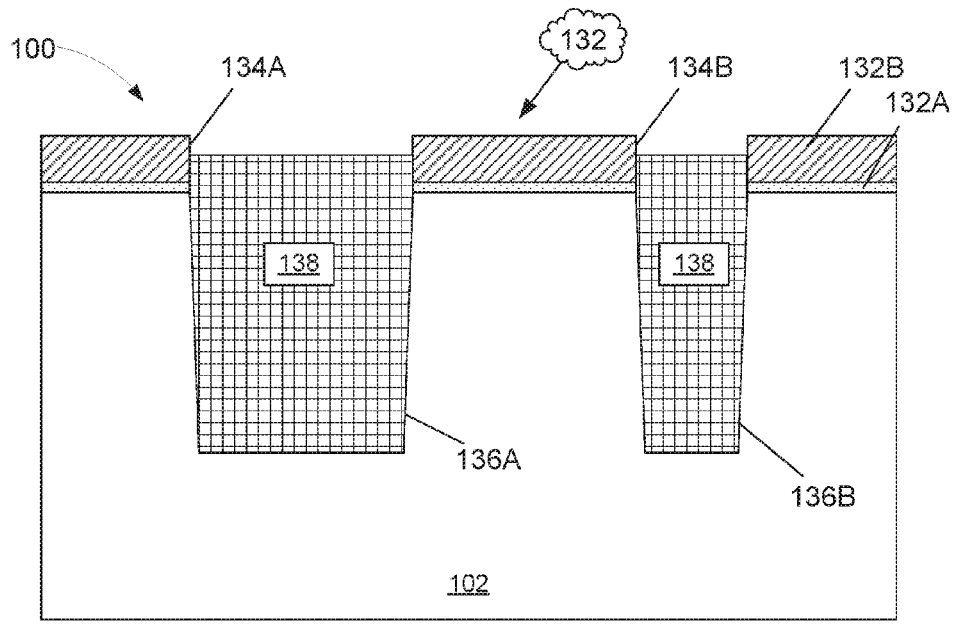

FIG. 2F depicts the product 100 after a sacrificial material 138 was initially formed in the sacrificial material trenches 136A-B. The sacrificial material 138 may be made of a material that, depending on the etch chemistry employed, may exhibit little to no etch selectivity relative to the substrate 102 (and thus may be etched at the same time as the substrate) at a first point in the process flow, yet may be selectively etched relative to the substrate 102, and thereby removed, at a later point in the process by using a different etch chemistry. In one illustrative embodiment, the sacrificial material 138 may be comprised of a semiconductor material, such as silicon-germanium ($Si_xGe_{1-x}$), amorphous silicon, etc. In the case where the sacrificial material 138 is comprised of a semiconductor material, such as SiGe, the sacrificial material may be formed by performing an epitaxial deposition process so as to over-fill at least the sacrificial material trenches 136A-B. In the depicted example, the formation of the sacrificial material 138 was performed by performing an epi process that was stopped prior to the epi material growing above the upper surface of the patterned masking layer 132. In the case where the sacrificial material 138 is formed by performing a traditional blanket or conformal deposition process, the sacrificial material 138 may be present above the upper surface of the patterned masking layer 138 at this point in the process flow.

Figure 2G:
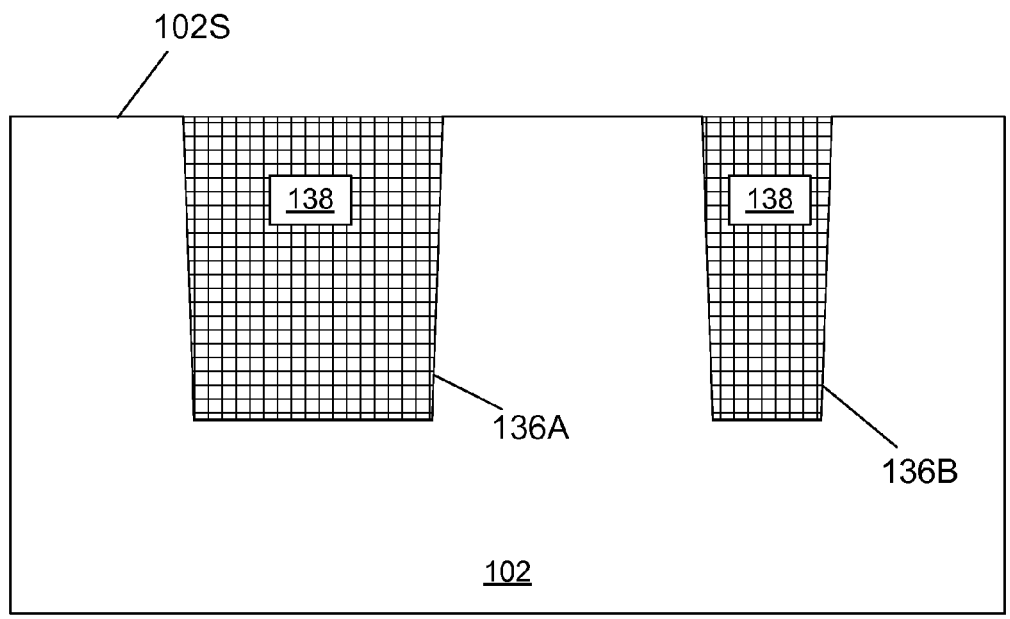

FIG. 2G depicts the product after one or more process operations, e.g., one or more chemical mechanical polishing (CMP) processes, were performed using the upper surface 102S of the substrate as the final polish-stop layer. As depicted, during these operations, the patterned masking layer 132 and the excess portions of the sacrificial material 138 are removed. As a result, the now-filled sacrificial material trenches 136A-B are spaced-apart islands of the sacrificial material 138 within the substrate 102 at locations that correspond to the location and configuration of the regions 130A-B where the to-be-removed portions of the fins 107R1-R3 will be formed. In general, the spaced-apart islands of the sacrificial material 138 will be at the same location as the openings 134A-B shown in the plan view of FIG. 2D. At the point depicted in FIG. 2G, the fin formation process may now begin of the now-modified substrate 102 with the spaced-apart regions of sacrificial material 138 formed therein.

Figure 2H:
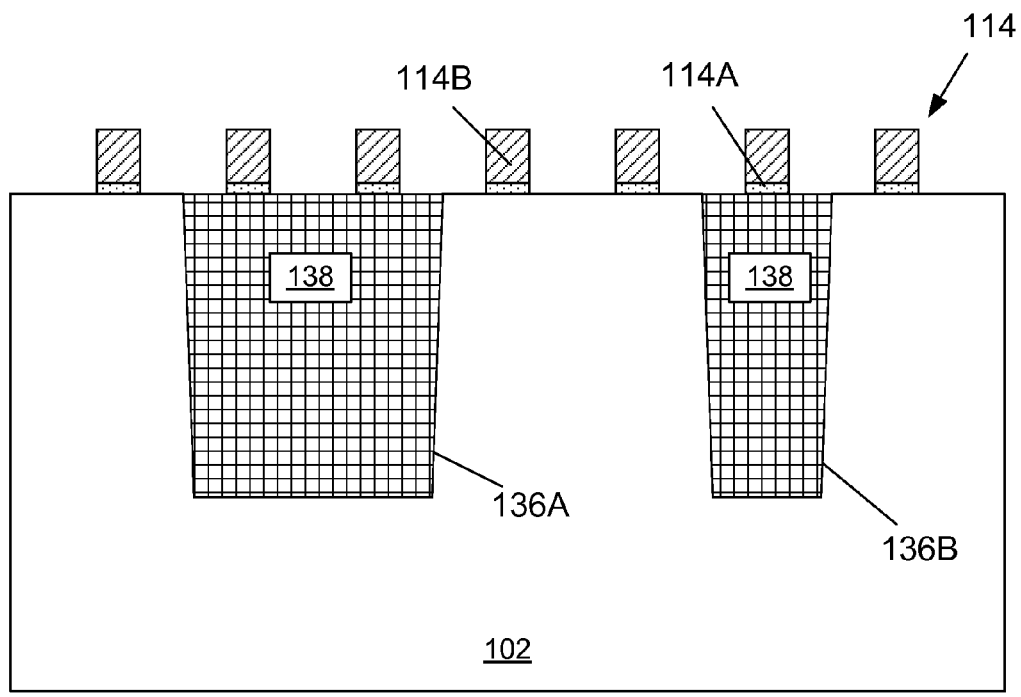

FIG. 2H depicts the product 100 after the above-described trench-patterning hard mask layer 114 was formed above the substrate 102 and the spaced-apart regions of sacrificial material 138 formed therein.

Figure 2I:
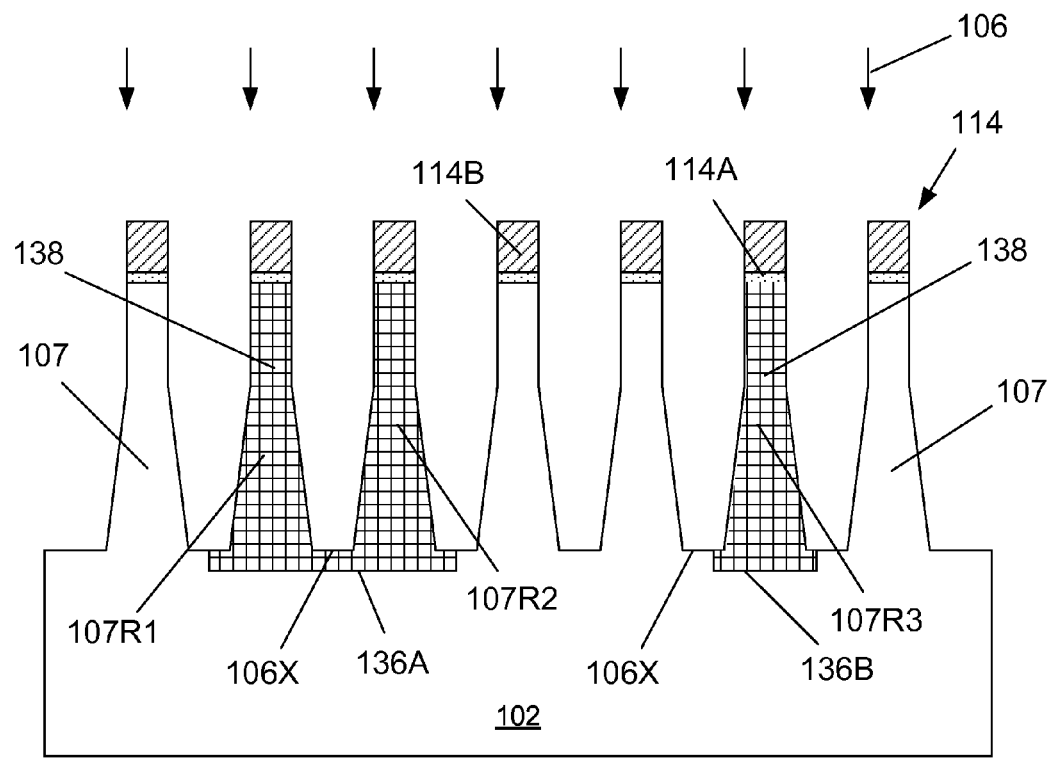

FIG. 2I depicts the product 100 after the above-described etching process 106 was performed to define the fins 107 (including the fins 107R) in the substrate 102. At this point in the process flow, the etching process 106 is performed with an etch chemistry such that the substrate material 102 and the sacrificial material 138 may be removed in a common etch process while exhibiting very little relative etch selectivity between the two materials. For example, in the case where the substrate 102 is made of silicon and the sacrificial material 138 is made of silicon-germanium, the etch process 106 may be an anisotropic etching process, e.g., a Br-based reactive ion etching process.

Figure 2J:
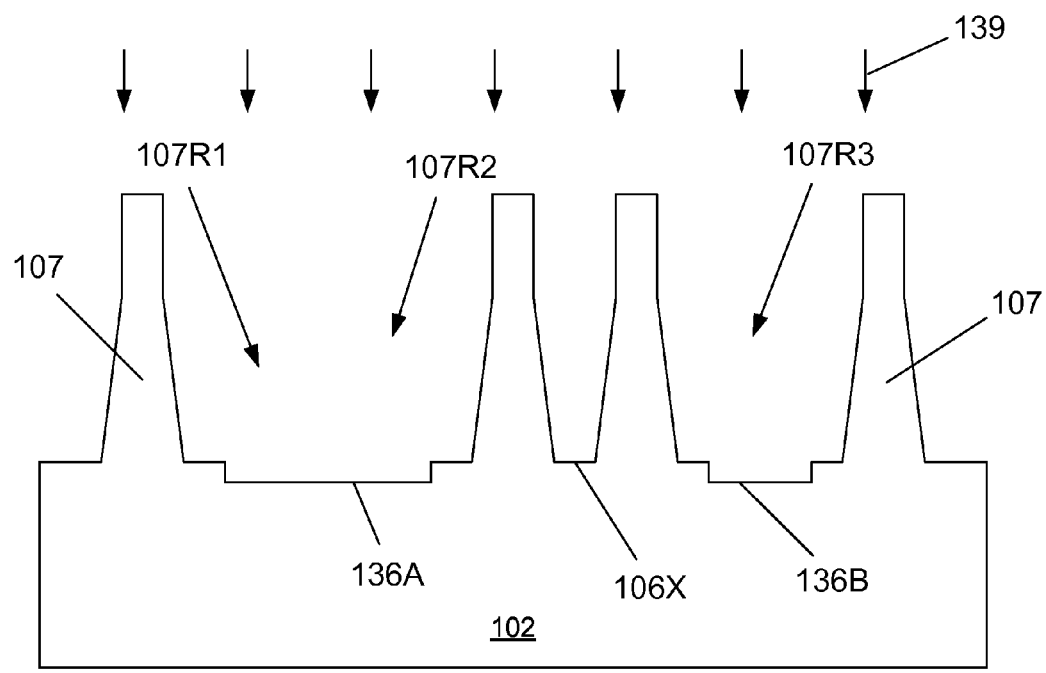

The next process operation involves removing the desired portions of the fins 107R1-R3 selectively relative to the remaining portions of the fins 107 (and portions of the fins 107R) that are to be kept and used as part of the product 100. Accordingly, FIG. 2J depicts the product 100 after a selective etching process 139 was performed to remove the portions of the sacrificial material 138 that correspond to the desired portions of the fins 107R1-3 to be removed relative to the other desired portions of the fins 107 and the surrounding substrate. That is, at this point in the process flow, the etching process 139 is performed with an etch chemistry where there is a relatively high degree of etch selectivity between the substrate material 102 and the sacrificial material 138. For example, in the case where the substrate 102 is made of silicon and the sacrificial material 138 is made of silicon-germanium, the etch process 139 may be an isotropic etching process that is performed using, for example, HCl or $HF/HNO_3/CH_3COOH$. In one embodiment, the patterned masking layer 132 may be removed prior to performing the etch process 139. As depicted in FIG. 2J, performing the etching process 139 results in the removal of substantially all of the portions of the sacrificial material 138 that correspond to the portions of the fins 107R that are desired to be removed.

Figure 2K:
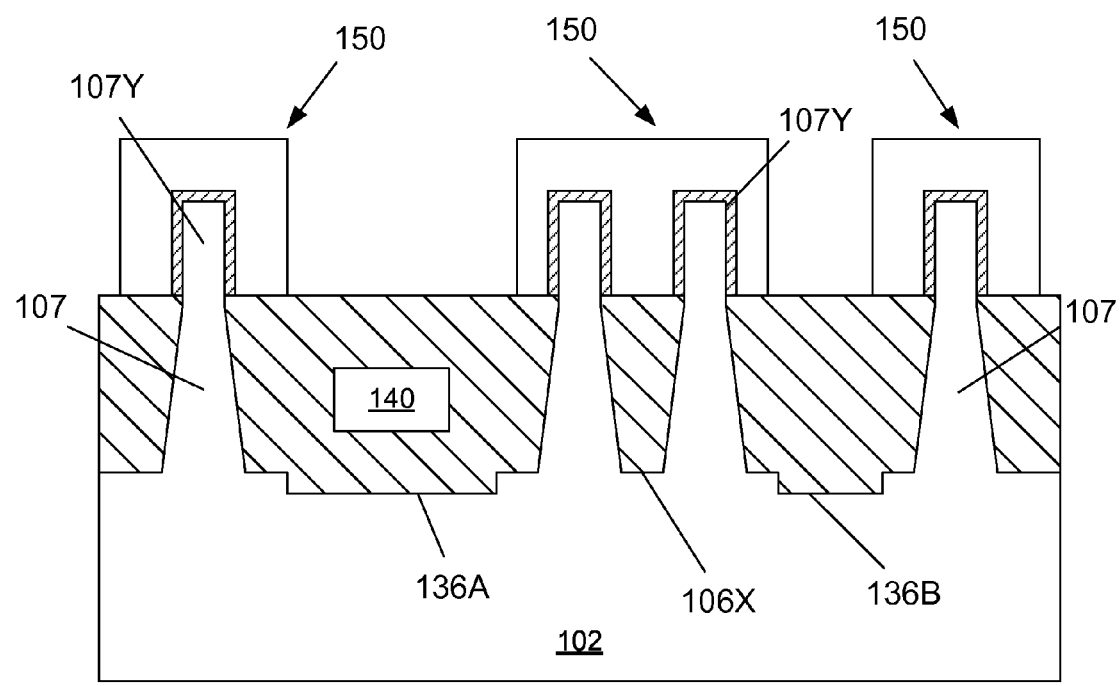

FIG. 2K depicts the product 100 after several process operations were performed. First, a layer of insulating material 140, such as silicon dioxide, was formed so as to overfill the trenches between the remaining fins. A chemical mechanical polishing (CMP) process was then performed to planarize the upper surface of the insulating material 140 with the upper surface of the fins 107. Thereafter, an etch-back process was performed to recess the layers of insulating material 140 to the desired level and thereby expose a desired amount 107Y of the initial fins 107, which corresponds to the final fin height for the fins of the product 100. At the point of fabrication depicted in FIG. 2K, traditional manufacturing operations may be performed to complete the formation of the product 100. For example, schematically depicted gate structures 150 (for three separate FinFET devices) may be formed using either gate-first or gate-last manufacturing techniques. Additionally, various source/drain and gate contact structures may be formed on the device, various metallization layers may be formed above the product 100 using known processing techniques, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of removing a portion of a fin, comprising:
    forming an embedded region of a sacrificial material in a semiconductor substrate at a location where the portion of the fin to be removed will be located;
    after forming said embedded region of said sacrificial material, performing at least one first etching process to form a plurality of fin-formation trenches that define said fin, wherein at least a portion of said fin is comprised of said sacrificial material; and
    performing at least one second etching process to selectively remove substantially all of said sacrificial material portion of said fin relative to material of said substrate.

2. The method of claim 1, wherein an entire axial length of said fin is comprised of said sacrificial material.

3. The method of claim 1, wherein said at least one first etching process is performed with an etch chemistry that is substantially non-selective as between said sacrificial material and said substrate material.

4. The method of claim 3, wherein said at least one second etching process is performed with an etch chemistry that is highly selective as between said sacrificial material and said substrate material.

5. The method of claim 1, wherein said substrate is made of silicon and said sacrificial material is silicon-germanium ($Si_xGe_{1-x}$) or amorphous silicon.

6. The method of claim 1, wherein forming said embedded region of said sacrificial material in said substrate comprises forming a rectangular-shaped region, when viewed from above, of said sacrificial material that extends for less than an entire axial length of said fin.

7. The method of claim 1, wherein forming said embedded region of said sacrificial material in said substrate comprises forming a rectangular-shaped region, when viewed from above, of said sacrificial material that extends for substantially an entire axial length of said fin.

8. The method of claim 1, wherein forming said embedded region of said sacrificial material in said substrate comprises:
   forming a first patterned masking layer on said substrate, said first patterned masking layer having an opening in a position that corresponds to the location where said portion of the fin to be removed will be located, said opening in said first patterned masking layer exposing a surface of said substrate;
   performing at least one first etching process through said opening in said first patterned masking layer to form a sacrificial material trench in said substrate;
   forming said sacrificial material so as to over-fill said sacrificial material trench with said sacrificial material; and
   performing at least one process operation to remove said first patterned masking layer from above said substrate and to planarize an upper surface of said sacrificial material within said sacrificial material trench with an upper surface of said substrate.

9. The method of claim 8, further comprising forming a second patterned masking layer above said substrate, wherein said at least one first etching process that is performed to form the plurality of trenches that define said fin is performed though said second patterned masking layer.

10. The method of claim 1, wherein said at least one first etching process is a Br based reactive ion etching process.

11. The method of claim 10, wherein said at least one second etching process is an isotropic etching process that is performed using an etch chemistry comprised of HCL or $HF/HNO_3/CH_3COOH$.

12. The method of claim 1, wherein said at least one first etching process and said at least one second etching process are both anisotropic etching processes.

13. The method of claim 8, wherein forming said sacrificial material so as to over-fill said sacrificial material trench comprises performing an epitaxial deposition process to form said sacrificial material.

14. A method of removing a portion of a fin, comprising:
   forming a first patterned masking layer above a semiconductor substrate, said first patterned masking layer having an opening in a position that corresponds to a location where a portion of the fin to be removed will be located, said opening in said first patterned masking layer exposing a surface of said substrate;
   performing at least one first etching process through said opening in said first patterned masking layer to form a sacrificial material trench in said substrate;
   forming sacrificial material so as to over-fill said sacrificial material trench with said sacrificial material;
   performing at least one process operation to remove said first patterned masking layer from above said substrate and to planarize an upper surface of said sacrificial material within said sacrificial material trench with an upper surface of said substrate;
   after performing said at least one process operation, forming a second patterned masking layer above said substrate;
   performing at least one second etching process through said second patterned masking layer to form a plurality of fin-formation trenches that define said fin, wherein at least a portion of said fin is comprised of said sacrificial material; and
   performing at least one third etching process to selectively remove substantially all of said sacrificial material portion of said fin relative to said substrate.

15. The method of claim 14, wherein an entire axial length of said fin is comprised of said sacrificial material.

16. The method of claim 14, wherein said at least one second etching process is performed with an etch chemistry that is substantially non-selective as between said sacrificial material and said substrate material.

17. The method of claim 16, wherein said at least one third etching process is performed with an etch chemistry that is highly selective as between said sacrificial material and said substrate material.

18. The method of claim 14, wherein said substrate is made of silicon and said sacrificial material is silicon-germanium ($Si_xGe_{1-x}$) or amorphous silicon.

19. The method of claim 14, wherein said at least one second etching process is a Br-based reactive ion etching process.

20. The method of claim 19, wherein said at least one third etching process is an isotropic etching process that is performed using an etch chemistry comprised of HCL or $HF/HNO_3/CH_3COOH$.

21. The method of claim 14, wherein said at least one second etching process and said at least one third etching process are both anisotropic etching processes.

22. The method of claim 1, wherein said embedded region of said sacrificial material is formed having an upper surface that is substantially co-planar with an upper surface of said semiconductor substrate.

* * * * *